United States Patent
Von Känel et al.

(10) Patent No.: US 6,454,855 B1
(45) Date of Patent: Sep. 24, 2002

(54) METHOD FOR PRODUCING COATED WORKPIECES, USES AND INSTALLATION FOR THE METHOD

(75) Inventors: Hans Von Känel, Wallisellen; Carsten Rosenblad, Zürich; Jurgen Ramm, Sevelen, all of (CH)

(73) Assignee: Unaxis Trading AG, Trübbach (CH)

( * ) Notice: Subject to any disclaimer, the term of this patent is extended or adjusted under 35 U.S.C. 154(b) by 0 days.

(21) Appl. No.: 09/460,210

(22) Filed: Dec. 13, 1999

Related U.S. Application Data

(63) Continuation of application No. PCT/CH98/00221, filed on May 27, 1998.

(30) Foreign Application Priority Data

Jun. 13, 1997 (CH) .............................................. 1445/97

(51) Int. Cl.$^7$ .............................................. C30B 29/06
(52) U.S. Cl. .......................... 117/92; 117/103; 117/108; 117/935
(58) Field of Search .......................... 117/935, 92, 103, 117/108

(56) References Cited

U.S. PATENT DOCUMENTS

| | | | |
|---|---|---|---|
| 4,443,488 A | | 4/1984 | Little et al. |
| 5,052,339 A | * | 10/1991 | Vakerlis et al. .............. 118/723 |
| 5,554,222 A | | 9/1996 | Nishihara et al. |
| 5,730,808 A | * | 3/1998 | Yang et al. .................. 136/249 |

FOREIGN PATENT DOCUMENTS

| | | |
|---|---|---|
| DE | 36 14 384 | 1/1987 |
| GB | 2 219 578 | 12/1989 |

OTHER PUBLICATIONS

"Plasma–Enhanced Chemical Vapor Deposition of Epitaxial Silicon From Silane", S.R. Shanfield, Ext. Abstracts, vol. 83–1, 1983, pp. 230–231, XP002056339.

"Low Temperature Deposition of Microcrystalline Silicon In A Multipolar Plasma", T.D. Mantei et al. Ext. Abstr., vol. 85, No. 2, 1985, pp. 396–397, XP002056340.

"Plasma–Assisted CVD of Diamond Films By Hollow Cathode ARC Discharge" Diamond and Related Materials, vol., 2, No. 2/04, Mar. 31, 1993, pp. 413–416, XP000360820.

"Silicon from silane through plasma deposition", S.J. Solomon, Fifteenth IEEE Photovoltaic Specialists Conf.— 1981, Kissimmee, FL May 12–15, 1981, pp. 569–571, XP002056341 1981, New York, NY, USA, IEEE.

"Hydrogen plasma chemical cleaning of metallic substrates and silicon wafers", $22^{nd}$ Int'l Conf. On Metallurgical Coating and Thin Films, San Francisco, CA 24–28, Apr. 1995, vol. 77 No. 1–3, pp. 731–737 XP002056342., ISSN 0257–8972, Surface and Coatings Tech., Dec. 1995, Elsevier, Switzerland.

"Hollow Cathode Plasma Assisted Chemical Vapor Deposition of Diamond", B. Singh et al., Applied Physics Letters, vol. 52, No. 20, May 16,1988, pp. 1658–1660, XP000119536, see p. 1658, right–hand col., line 3–p. 1659, right–hand col., line 32.

"Low Temperature Plasma–Enhanced Epitaxy of GaAs", Journal of the Electrtochemical Society, vol. 131, No. 6, Jun. 1984, pp. 1357–1359, XP002056343, US, see p. 1357, left hand column, line 32–p. 1358, left–hand column, line 17.

* cited by examiner

Primary Examiner—Robert Kunemund
(74) Attorney, Agent, or Firm—Crowell & Moring LLP

(57) ABSTRACT

The method is characterized in that layers of sufficient quality for epitaxy are placed on workpieces, at a considerably increased deposition rate. To this end, instead of a UHV-CVD or ECR-CVD method, for example, a PECVD method is used by means of a DC plasma discharge.

88 Claims, 4 Drawing Sheets

METHOD FOR PRODUCING COATED WORKPIECES, USES AND INSTALLATION FOR THE METHOD

This is a continuation of PCT/CH98/00221 filed May 27, 1998.

The present invention relates to a method for producing coated workpieces according to the preamble of Claim 1, to uses therefor according to Claims 28 to 35, to an installation for implementing the above-mentioned method according to the preamble of Claim 36 and to uses therefor according to Claims 51 to 54.

The present invention is based on problems which occur during the manufacturing of thin layers by means of CVD and PECVD methods. The findings made in this case, according to the invention, can be applied particularly to the production of semiconductor layers, for example, when producing solar cells or modulation doped FETs or hetero-bipolar transistors.

Thin semiconductor films are deposited either in a monocrystalline form, that is, epitaxially, on an also monocrystalline substrate, such as a silicon substrate, or are deposited in a polycrystalline form or amorphous form on polycrystalline or amorphous substrates, such as glass. Although in the following the invention will be described mainly with respect to the production of silicon-coated and/or germanium-coated substrates, it may, as mentioned above, also be used for the production of other workpieces and workpieces coated with other materials.

Known methods for depositing epitaxial semiconductor films are:

Molecular beam epitaxy (MBE), chemical vapor deposition (CVD), remote plasma enhanced CVD with DC or HF discharge, electron cyclotron resonance plasma-assisted CVD. (ECRCVD).

"CVD method" is a collective term for a large number of thermal deposition methods which differ either in the construction of the assigned apparatuses or in their operating mode. Thus, for example, a CVD method can be carried out at a normal atmospheric pressure or at much lower pressures down into the range of the ultra high vacuum. Reference can be made in this respect to (1) as well as to (2).

In the commercial production of epitaxial Si layers, only CVD is normally used. In this case, the applied reactive gases are silicon-containing gases, such as silane chlorides, $SiCl_4$, $Si,HCl$ and $SiH_2Cl_2$ as well as silanes, such as $SiH_4$, or $Si_2H_4$. Characteristics of the standard CVD methods are the high deposition temperatures in the order of 1,000° and more, as well as pressures of typically 20 mbar to 1,000 mbar, that is, to normal atmospheric pressure.

Translator's note: The subscripts on this page are only guesses since most are illegible in the German.

According to the process conditions, coating rates of several μm per minute can be achieved in this manner, corresponding to several 100 Å/sec., with respect to which reference is again made to (1).

In contrast, low pressure chemical vapor deposition (LPCVD), which is synonymous with low pressure vapor phase epitaxy (LPVPE), takes place at pressures below 1 mbar and permits lower process temperatures to typically 700° C. In this respect, reference is made, in addition to (1), also to (3) and (6).

With respect to the LPCVD and with reference to (6), at a deposition temperature of 650° C., a growth rate of $GR$=50 Å/min is indicated. This takes place at a reactive gas flow for silane of $F$=14 sccm.

This results in a characteristic number which is relevant to the gas yield, specifically the growth rate per reactive gas flow unit $GR_F$ at $GR_F$=3.6 Å/(sccm·min)

On 5" wafers, corresponding to a surface $A_S$=123 cm$^2$, converted from the actual surface $A_2$ for 2" wafers, a deposition quantity (growth amount) GA is obtained at $GA$=5.2·10$^{14}$ Si atoms/sec.

Again, with respect to a reactive gas flow unit, the characteristic number "deposition quantity per reactive gas flow unit", in the following called "gas utilization number", $GA_F$ is obtained at $GA_F$=8.4·10$^{-3}$, corresponding to 8.4 o/oo.

At 650°, an epitaxial layer is formed.

If the deposition temperature is reduced to 600° C., a polycrystalline layer is formed. In this case, the following applies:

GR=3 Å/min

F=28 sccm silane $GR_F$=0.11 Å/sccm/min)

GA=3.1·10$^{15}$ is Si atoms/sec on $A_R$ $GA_F$=2.5·10$^{-4}$, corresponding to 0.25 o/oo.

Basically, the following criteria are required for a defect-free epitaxial layer growth:

In the case of transmission electron microscopy on cross-sectional preparations, the proof of epitaxy is established by electron diffraction and high resolution.

In the area of 10 to 15 μm, which in this case can typically be penetrated by radiation, along the boundary surface to the substrate, no defects must be visible. Typical enlargements in the analysis of defects are 110,000 to 220,000.

Another development is the ultra high vacuum chemical vapor deposition (UHV-CVD) with working pressures in the range of 10$^{-4}$ to 10$^{-2}$ mbar, typically in the range of 10$^{-3}$ mbar, with respect to which reference is made to (4) as well as to (5), (7). It permits very low workpiece temperatures; however, the growth rates or coating rates being extremely low; thus, for example, approximately 3 Å/min for pure silicon at 550° C. according to (5).

The reason for the low growth rates is the fact that the absorption rate and decomposition rate of the reactive molecules, thus, for example, of $SiH_4$, decreases with an increasing hydrogen coating of the workpiece surface. The layer growth is therefore limited by the desorption rate of $H_2$, which, however, rises exponentially with the temperature. In this respect, reference is made to (8). Because of the lower bonding energy of the Ge—H bonding in comparison to the Si—H bonding, the hydrogen desorption of an Si—Ge alloy surface is higher, so that, while the substrate temperature is the same, a higher growth rate is obtained than in the case of pure Si; for example, at a content of 10% Ge by a factor 25 at 550° C. (5).

Another possibility of achieving high deposition rates of an epitaxy quality at low substrate temperatures consists of (9) decomposing the reactive gases by means of a u-wave plasma (ECRCVD).

By the use of plasma sources, which are based on the principle of electron cyclotron resonance, the incidence of high-energy ions onto the substrate is to be avoided.

As a rule, such sources operate in the pressure range of $10^{-3}$ to $10^{-4}$ mbar, which, however, results in larger free path lengths than in the case of capacitively coupled-in high-frequency Hf plasmas. This, in turn, can lead to an undesirable ion bombardment of the substrate and thus to the generating of defects, as indicated in (10). The energy of the ions impacting on the substrate, however, can be limited by an external control of the substrate potential, whereby ion-related damage can largely be avoided. Also by means of the ECRCVD method, the growth rates for pure silicon, as a rule, amount only to a few 10 Å/min, at low deposition temperatures $\leq 600°$ C.

Summarizing, this results in the following:

Layers which are deposited with a quality which is suitable also for the depositing of epitaxial layers can be deposited at deposition temperatures $\leq$ up to now:

by UHV-CVD with growth rates GR of approximately 3 Å/min or

ECRCVD with a growth rate GR higher by approximately 1 order (30 Å/min).

PECVD methods, whose plasmas are produced by DC discharges, could be used for the manufacturing of layers of epitaxy quality—that is, a correspondingly lower fault density (see above)—neither for the construction of epitaxial nor for the construction of amorphous or polycrystalline layers; at least not with a growth rate GR, reliability and efficiency to be ensured for industrial manufacturing.

On the other hand, the use of capacitively coupled-in high-frequency fields for generating HF plasmas for PECVD methods was reported very early, with respect to which reference is made to (11). The difficulty of this approach is the fact that not only the reactive gases are decomposed in such Hf plasmas. Simultaneously, the substrate surface is exposed to an intensive bombardment of highly energetic ions, as utilized specifically also in the case of reactive atomizing or high-frequency etching. This, on the one hand, promotes the hydrogen desorption but, simultaneously results in defects in the growing layers. A method, which is modified in this respect, the RPCVD—remote plasma chemical vapor deposition—takes this into account in that the substrates to be coated are not exposed directly to the HF plasma, which leads to better results (12). However, the achieved growth rates are low, specifically usually fractions of nm per minute to no more than several nm per minute according to (13).

It is an object of the present invention to indicate a method which can be used in industrial manufacturing and which permits the growing of layers of an epitaxy quality which have significantly higher growth rates than previously known.

This is achieved by means of methods of the initially mentioned type which are characterized according to the characterizing part of Claim 1 and by a system which is characterized according to the characterizing part of Claim 36. Preferred embodiments of the method are specified in Claims 2 to 27; preferred embodiments of the system are specified in Claims 37 to 50. The method according to the invention is particularly suitable for the manufacturing of semiconductor-coated substrates with an epitaxial, amorphous or polycrystalline layer, in this case particularly of Si, Ge or Si/Ge alloy layers as well as Ga or Ga bonding layers.

In this case, particularly also doped semiconductor layers can be deposited; layers containing silicon and/or germanium, doped preferably with at least one element of Groups III or V of the classification of elements or layers containing gallium with at least one element of Groups II, III, IV or VI of the classification of elements, for example, with Mg or Si.

Concerning the initially discussed coating techniques for producing epitaxial layers, the following can be summarized:

The CVD methods, particularly the UHV-CVD methods, lead to excellent layer qualities even at substrate temperatures below 500° C. They are therefore suitable for also producing epitaxial layers, where extremely high demands are made on the layer quality. However, in the case of this method, the growth rate, for example, for Si, is extremely low, as mentioned above, in the order of 3 Å/min at 550° C.

Microwave-plasma-assisted methods, ECRCVD, have the advantage that the decomposition of the reactive molecules can take place without high thermal energy. The ion bombardment of the substrate leads to an increased hydrogen desorption. Both effects can result in a considerable increase of the growth rate. However, at low temperatures, unacceptably high defect densities are observed which are induced by the ion bombardment. Although a control by way of the substrate bias voltage increases the layer quality, it does not change the comparatively low rates.

Thus, there seems to be an inherent contradiction: An ion bombardment of the substrate, on the one hand, leads to an increased growth rate because of an increased hydrogen absorption, but simultaneously increases the defect density.

The following picture exists according to (2) for thermal CVD methods operated at atmospheric pressure:

Si growth rate GR: $2 \times 10^{-3}$ nm/min (at 600° C., measured $3 \cdot 10^{-2}$ and converted to 550° C.)

Gas flow, $SiCl_2H_2$, F: 100 sccm.

This results in a growth rate GR per $SiCl_2H_2$ flow unit, $GR_F 2 \times 10^{-4}$ Å/(sccm·min).

A gas flow F of 100 sccm $SiCl_2H_2$ corresponds to $4.4 \times 10^{19}$ molecules/sec.

The growth rate GR of $2 \times 10^{-3}$ nm/min corresponds to a growth rate of $2 \times 10^{-4}$ silicon monolayers per second on an S" wafer, corresponding to a surface $A_5$ of 123 cm$^2$. Thus, on the total surface, a deposited quantity of $$GA = 1.7 \times 10^{13} \text{ silicon atoms/sec.}$$

is obtained per second. By relating the silicon quantity deposited per second and the reactive gas quantity admitted per second, the gas utilization number $GA_F$ is obtained at $$GA_F = 3.9 \times 10^{-7}.$$

This corresponds to a utilization of approximately 0.0004 o/oo.

We note that, at atmospheric CVD, the following is obtained:

$GR_F \approx 2 \times 10^{-4}$ Å/(sccm·min)

$GA_F \approx 0.0004$ o/oo.

From (5), combined with (4) and (7), the following estimate is obtained for UHV-CVD:

$GR_F \approx 0.1$ Å/(sccm·min) and $GA_F \approx 0.0035$ corresponding to approximately 35 o/oo.

The above concerns the methods which so far have been used industrially for the production of epitaxy quality layers.

From German Patent Document DE-OS 36 14 384, a PECVD method is known in which DC glow discharge in the form of a low-voltage discharge is used. As the result, layers which have particularly good mechanical characteristics are to be deposited rapidly, that is at a high growth rate.

A cathode chamber with a hot cathode communicates with a vacuum recipient by way of a diaphragm. An anode is provided opposite the diaphragm. In parallel to the discharge axis formed between the diaphragm and the cathode, an inlet arrangement is provided for a reactive gas. Workpieces are arranged opposite this arrangement with respect to the discharge axis. With respect to the anode potential, discharge voltages $U_{AK}$ below 150 V are applied, and the discharge is operated with a current intensity $I_{AK}$ of at least 30 A. For the coating, the workpieces are brought to negative potentials between 48 and 610 V.

The tests illustrated therein result in the following picture:

| Example | GR (Å/min) | $GR_F$ (Å/(sccm.min)) |
| --- | --- | --- |
| 1 | $10^1$ | 2.5 |
| 2 | 380 | 1.2 |
| 3 | $2 \times 10^3$ | 2.5 |
| 4 (Si) | 166 | 0.7 |
| 5 | 466 | 1.2 |
| 6 | 750 | 0.7 |
| 7 | 250 | 0.5 |
| 8 | 500 | 0.75 |
| 9 | 316 | 0.38 |
| 10 | 344 | 0.18 |
| 11 | 62 | 0.18 |
| 12 | 58 | 0.14 |

The present invention is now based on the recognition that workpiece coatings can be carried out which have a layer quality which meets the demands made on epitaxy layers in that, for this purpose, in contrast to previous expectations, a non-microwave-plasma PECVD method is used—that is, a PECVD method with DC discharge—and specifically a PECVD method as known, with respect to its principle, from German Patent Document DE-OS 36 14 348. As will be illustrated, it will be possible to achieve in epitaxy quality:

a) Growth rates GR of at least 150 Å/min, even of at least 600 Å/min;

b) $GR_F$ of at least 7.5 Å/(sccm·min), or even 40 Å/(sccm·min), preferably even 75 Å/(sccm·min), and further c) gas utilization numbers $GA_F$ at least in the range of 5%.

It is recognized that, in the case of the DC-PECVD method used according to the invention, the plasma discharge leads to the lowest-energy ions, also to the lowest-energy electrons, but that the charge carrier density, particularly the electron density at the utilized discharge is very high.

In the following, the invention will be explained by means of figures on the basis of examples.

First, a system according to, for example, German Patent Document DE-OS 36 14 384 can definitely be used for implementing the method according to the invention if it is operated such that the conditions according to the invention are met.

Figure 1:
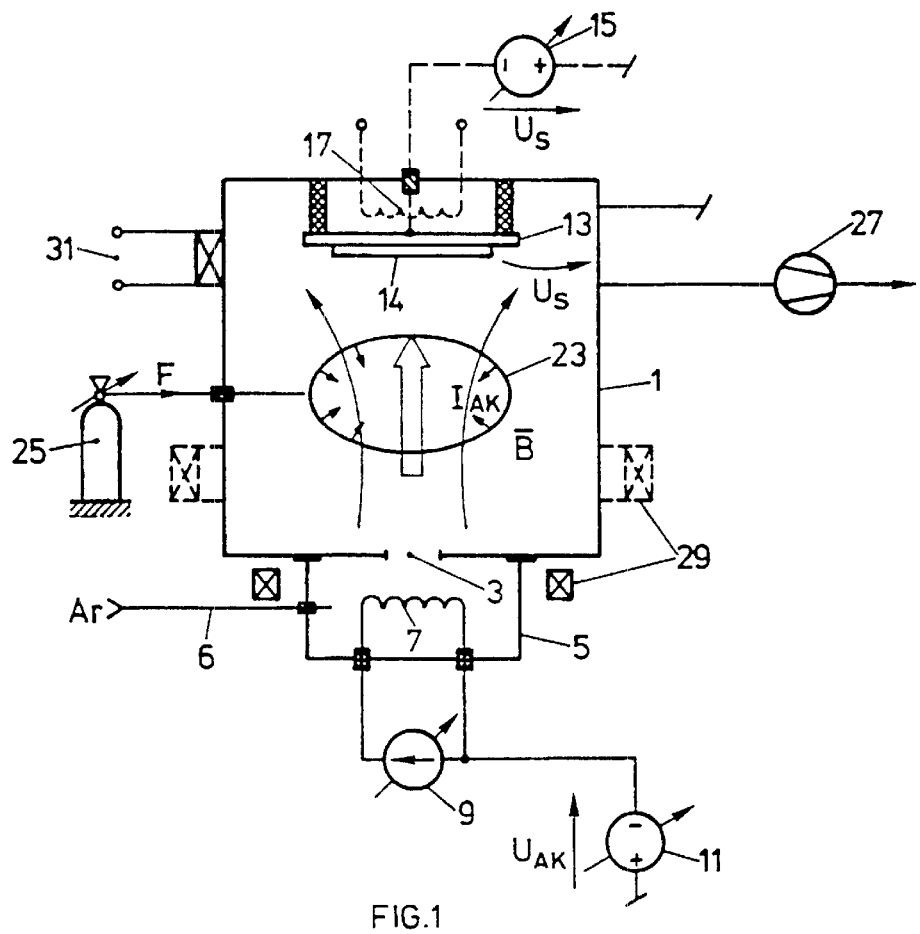
FIG. 1 is a schematic view of a first preferred embodiment of a system according to the invention for implementing the method according to the invention.

According to FIG. 1, a first system, which is currently preferred, for implementing the method according to the invention, has a vacuum recipient 1 to which a cathode chamber 5 is flanged by way of a diaphragm 3. In a known manner, the cathode chamber 5 may be applied to the electric potential of the recipient 1, or the cathode chamber 5 may be insulated with respect to the recipient 1 and be applied to a potential deviating therefrom (not shown).

In the cathode chamber 5, a hot cathode 7—a filament—is provided, preferably heated directly by means of a heating current generator 9.

A workpiece holder 13, which is mounted in an insulated manner, is provided in the diaphragm axis A opposite the diaphragm 3 in the recipient 1. A workpiece heater 17 can be provided in the area of the workpiece holder 13. The recipient 1 is evacuated by means of a vacuum pump 27, preferably a turbo vacuum pump, in this case, particularly a turbo molecular pump. For observation and possibly for control purposes, sensors, such as a plasma monitor, etc. may be provided at a connection 31.

Concentrically to the axis A of the discharge with the discharge current $I_{AK}$, a gas injection ring 23 is provided as a reactive gas injection arrangement connected with a gas tank arrangement 25 for reactive gas which, by means of a controllable flow F (sccm), is admitted into the recipient.

In the cathode chamber 5, a connection 6 leads to a working gas tank, for example, containing Ar. By means of an electro-magnet and/or permanent magnet arrangement 29, a magnetic field R is generated essentially concentrically to the axis A in the recipient, particularly also effectively in the area of the diaphragm 3. The field can preferably be displaced from the concentricity.

In its embodiment according to FIG. 1, the system is operated as follows:

The recipient wall corresponding to 1 is used as the anode of the discharge and for this purpose is switched to a reference potential, as illustrated, preferably to the ground. Correspondingly, by means of a preferably adjustable DC generator 11, the cathode 7 is connected to a (negative) potential. By way of the generator 11, the discharge voltage is $U_{AK}$; the discharge current $I_{AK}$ flows between the cathode 7 and the recipient 1.

In a second operating variant of the system illustrated in FIG. 1, the workpiece holder 13 is applied to the voltage $U_S$ by means of a DC bias generator 15.

Figure 2:
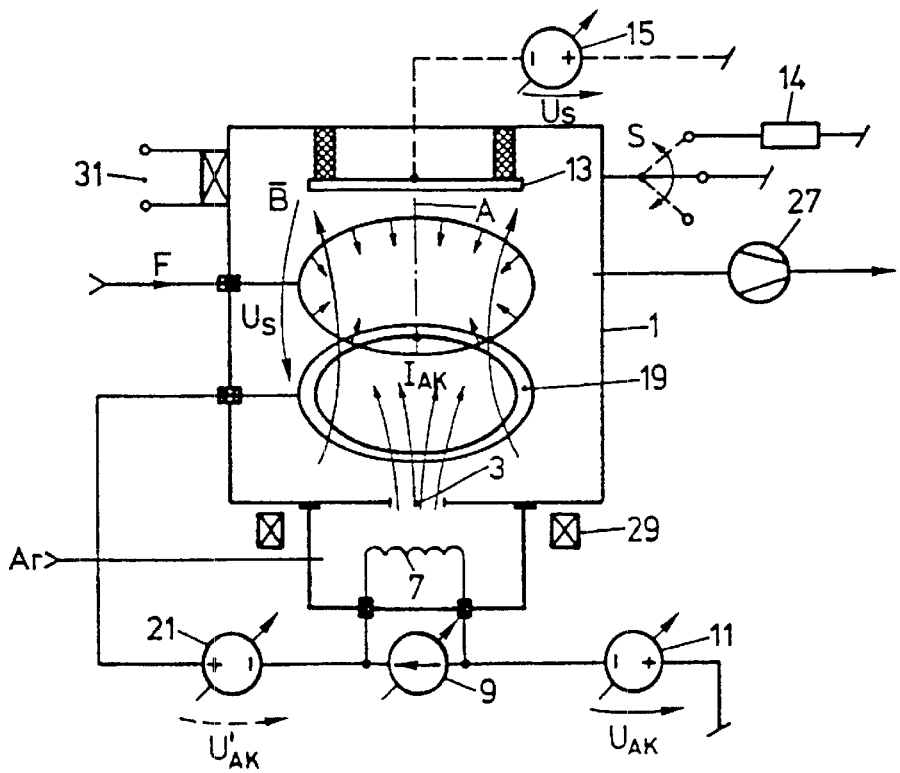
FIG. 2 is a schematic view of a second preferred embodiment of a system according to FIG. 1 with several operating variants.

FIG. 2 shows another preferred system according to the invention for implementing the method according to the invention. The same reference numbers as in FIG. 1 are used for identical parts. The system according to FIG. 2 differs as follows from the system illustrated and described in FIG. 1:

A ring-shaped auxiliary anode 19 is provided which is arranged concentrically to the discharge axis A.

The following operating modes can take place here:

As schematically illustrated by means of the variation switch S, the recipient wall of the recipient 1, as already illustrated in FIG. 1, is applied to a reference potential preferably a ground potential or, by way of an impedance element 14, preferably a resistor element, is anchored to a potential, preferably a reference potential, or is operated in a potential-floating manner. If the recipient 1 is applied to the reference potential, the auxiliary anode 19 is applied either to the potential of the recipient or is applied to voltage by means of a preferably adjustable DC generator 21.

If the recipient 1 is anchored by way of the impedance element 14 to the reference potential, the auxiliary anode is operated by means of the DC generator 21. The discharge voltage $U_{AK}$ appears as illustrated by a broken line between the cathode 7 and the auxiliary anode 19. This is also true when the recipient wall 1 is operated in a potential-floating manner.

Currently, the operation of the system according to FIG. 2 is preferred with the recipient wall connected to the ground and the auxiliary electrode 19 as well as the workpiece holder 13 operated in a potential-controlled manner. In all system variants, the following adjustments are essential:

Total Pressure $P_T$ in the Recipient:

$$10^{-4} \text{ mbar} \leq P_T \leq 10^{-1} \text{ mbar}$$

preferably $$10^{-3} \text{ mbar} \leq P_T \leq 10^{-2} \text{ mbar}$$

typically in the range of $5 \cdot 10^{-3}$ mbar. This pressure is mainly ensured by the partial pressure of the working gas, preferably argon. As mentioned above, the vacuum pump 27, for this purpose is preferably constructed as a turbo vacuum pump, particularly a turbo molecular pump.

Working Gas Pressure $P_A$:
This pressure is selected as follows:

$$10^{-4} \text{ mbar} \leq P_A \leq 10^{-1} \text{ mbar}$$

preferably $$10^{-1} \text{ mbar} \leq P_A \leq 10^{-2} \text{ mbar}$$

Reactive Gas Partial Pressure $P_R$:
This pressure is preferably selected as follows:

$$10^{-1} \text{ mbar} < P_R \leq 10^{-1} \text{ mbar}$$

preferably $$10^{-4} \text{ mbar} \leq P_R \leq 10^{-2} \text{ mbar}.$$

Particularly for silicon-containing and/or germanium-containing gases, partial pressures between $10^{-4}$ mbar and $25 \cdot 10^{-1}$ mbar are advisable. For promoting the (illegible—translator) (surface roughness), mainly for multiple-layer depositions and layers with doping, it is also advisable to additionally provide a hydrogen partial pressure in the order of form $10^{-4}$ to $10^{-1}$ mbar, preferably of approximately $10^{-2}$ mbar.

Gas Flows:

Argon: Largely dependent on recipient volume and cathode chamber volume, for the setting of the required partial pressure $P_A$ and $P_T$.

Reactive gas flow: 1 to 100 sccm, particularly for silicon-containing and/or germanium-containing gases:

$H_2$: 1 to 100 sccm.

Discharge Voltage $U_{AK}$:

The discharge voltage, whether between the cathode 7 and the recipient 1 according to FIG. 1 or between the cathode 7, the recipient 1 and the auxiliary cathode 19 or between the cathode 7 and the auxiliary anode 19, is set as follows:

$$10 \text{ V} \leq U_{AK} \leq 80 \text{ V},$$

preferably $$20 \text{ V} \leq U_{AK} \leq 35 \text{ V}.$$

Discharge Currents, $I_{AK}$:
These are selected as follows:

$$5 \text{ A} \leq I_{AK} \leq 400 \text{ A},$$

preferably $$20 \text{ A} \leq I_{AK} \leq 100 \text{ A}.$$

Workpiece Voltage $U_S$:
In each case, this voltage is selected below the sputtering threshold of the discharge. It is set in all cases as follows:

$$-25 \text{ V} \leq U_S \leq +25 \text{ V},$$

preferably for Ga bonding, preferably for Si, Ge and their bonds $$-20 \text{ V} \leq U_S \leq 20 \text{ V},$$

preferably negative, and in this case preferably $$-15 \text{ V} \leq U_S < -3 \text{ V}.$$

Current Density at the Site of the Workpiece Surfaces to Be Coated:

This density is first measured by means of a probe at the site where then the surface to be coated will be positioned. It is set relative to the probe surface at at least 0.05 A/cm², preferably at least 0.1 A/cm² to maximally discharge current/substrate surface.

This current density is measured and set as follows:

One or several probes are positioned at the site of the surface which will be coated and, with respect to the ground or anode potential, are connected to variable positive voltage. This voltage is increased until the measured current does not continue to rise. Relative to the probe surface, the measured current value indicates the entire current density. This current density will then be set to the required value by adjusting the discharge. The setting of the above-mentioned current density values can easily be carried out by means of the preferably set discharge currents $I_{AK}$ between 5 and 400 A, or and preferably between 20 and 100 A.

The high flux of low-energy ions and electrons which impact on the workpiece is a characteristic of the method according to the invention, which is therefore abbreviated LEPECVD for "Low Energy Plasma Enhanced CVD".

During the coating, silicon and/or germanium layers can be doped by the addition of a doping gas with an element of Group III or V of the Classification of Elements, such as phosphine, boroethane, arsine, etc. to form n-conductive or p-conductive layers. Thus, p/n semiconductor transitions can be produced in situ, for example, particularly economically for the manufacturing of solar cells.

When gallium layers or gallium bonding layers are deposited, these can be doped by using a doping gas with an element of Groups II or III or IV or VI of the Classification of Elements, for example, with Mg or Si.

By means of the anode 19 and/or the magnetic field B, the low-voltage discharge can be compressed and/or can be deflected with respect to the workpiece holder 13. As the result, the plasma density at the workpiece holder can be increased (rate) and/or can be varied over a large range (adjustment of the distribution) or can be wobbled or deflected in a controlled manner. By means of the heater 17, the workpieces and substrates can be heated independently of the ion and/or electron yield to approximately 800° C. By means of permanent and/or electro-magnets, the magnet arrangement 29 generates the field B, preferably with a flux density of several 10 to several 100 gauss in the discharge space.

Because of the unusually low discharge voltages, as mentioned above, preferably in the range of from 20 to 35 V, a plasma potential of the discharge corresponding to (15) is obtained close to the anode potential. With respect to the potential, the workpiece or substrate potential can easily be adjusted such that the ion energies are below 15 eV, whereby ion-related damage during the layer growth on the workpiece can be completely avoided.

As mentioned above, a plasma density which is as high as possible must be endeavored on the workpiece. In the present case, the plasma density is defined by the current density at the workpiece surface. As indicated above, it is measured and set by means of probes in one calibrating operation.

The systems as illustrated schematically in FIGS. 1 and 2 currently are probably preferred embodiments. According to the method of the invention, they can definitely also be implemented on systems which are shown, for example, in German Patent Document DE-OS 36 14 384, if they are equipped and operated correspondingly. Up to now, the potential-controlled operation of the workpiece appears to be significant.

By means of a system as schematically illustrated in FIG. 2, R"-silicon monocrystal substrates are epitaxially coated with silicon or a silicon/germanium alloy. The volume of the recipient 1 amounted to 60 l.

The system was operated as follows:

Auxiliary anode 19 to potential of the recipient; workpiece holder 13 to controlled bias potential. Recipient as anode to ground.

The following operating point adjustments were made:

Workpiece Temperatures $T_S$:

In a plasma-induced manner, workpiece temperatures of only a few 100° C., thus, for example, of approximately 150° C., are obtained.

This is extremely advantageous for coating thermally critical substrates, such as organic substrates.

Higher desired temperatures are achieved by a separate heating. For producing Si and/or Ge layers and layers with Ge—Si bonding, workpiece temperatures $T_S$ $$300° \text{ C.} \leq T_S \leq 600° \text{ C.}$$

are advisable; for Ga layers or Ga bonding layers:

$$300° \text{ C.} \leq T_S \leq 800° \text{ C.}$$

are advisable.

Because the method is "cold", the temperature selection is very flexible, depending on the layer material and the substrate material.

|      | Flux (sccm) | Partial Pressure (mbar) |
|------|-------------|-------------------------|
| Ar   | 50          | $6.8 \times 10^{-3}$    |
| $H_2$ | 5          | $7 \times 10^{-4}$      |
| $SiH_4$ | 10       | $10^{-3}$               |

Discharge Current $I_{AK}$: 70 A.
Discharge voltages $U_{AK}$: 25 V.
Substrate temperature: 550° V (heated by means of heater)

Figure 3:
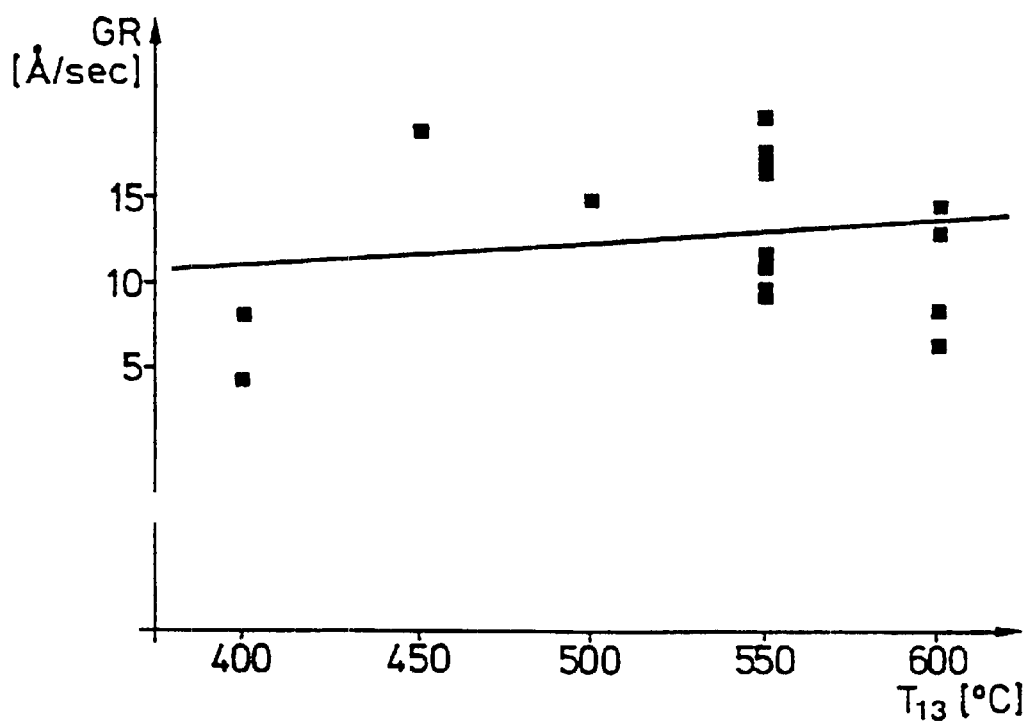
FIG. 3 is a view of the dependence of the growth rate on the wafer temperature during the operation of a system according to FIG. 2 for a silicon coating.

In a first test, the substrate temperature was varied by means of the heater 17. In this case, the other operating point parameters remain constant. FIG. 3 illustrates the result. This figure shows that the growth rate GR depends only very little on the workpiece temperature or substrate temperature $T_{13}$. The large scattering of the measured values is the result of the fact that, in the case of the test system, before each deposition, operating parameters in each case had to be adjusted again manually.

Based on the above-mentioned operating point values, the discharge current $I_{AK}$ was now varied by adjusting the discharge voltage $U_{AK}$ and optionally the variation of the cathode heating current. All other parameters were kept constant again. Although the discharge current $I_{AK}$ also does not correspond directly to the charge carrier density or the plasma density on the surface to be coated, nevertheless, while the parameters otherwise remain constant, the plasma density, corresponding to the current density on the workpiece surface to be coated, is essentially proportional to the discharge current. The result illustrated in FIG. 4 therefore definitely shows the proportionality and the proportionality factor between the growth rate GR and the plasma density. This proportionality should last as long as the gas utilization does not exceed approximately 60% and saturation effects occur. As mentioned above, the plasma density can be affected, in addition to, for example, by the adjustment of the discharge current, also by focussing or defocussing the low voltage discharge or by its deflection. Here also, the relatively large scattering is the result of the approach during the setting of the discharge conditions.

Figure 5:
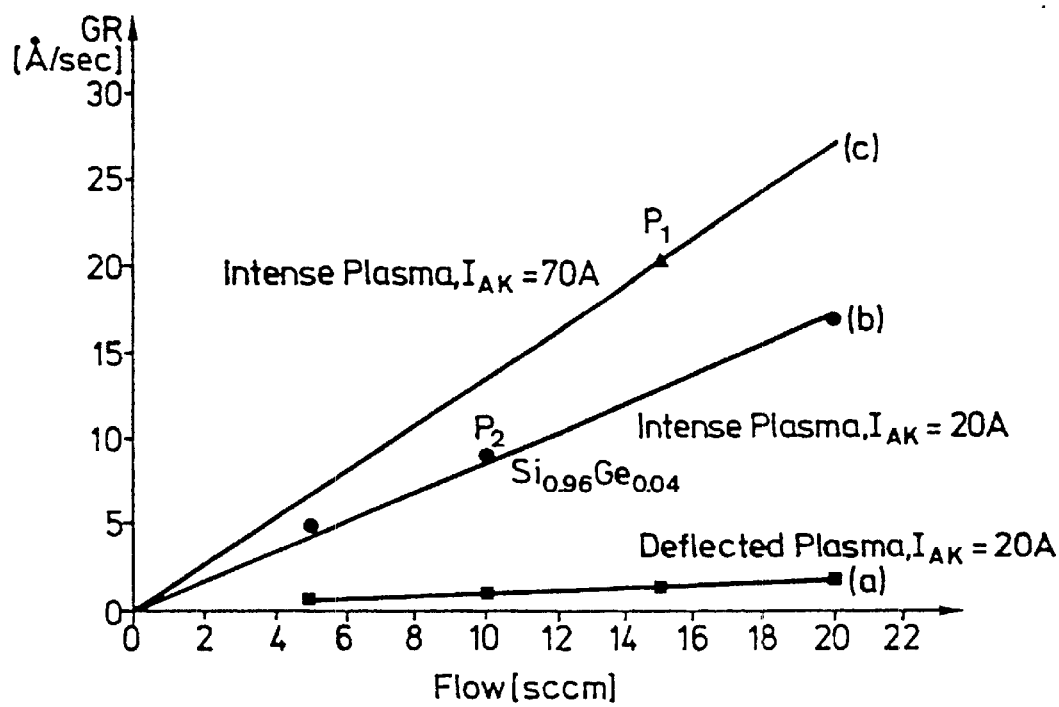
FIG. 5 is a view of the growth rate at different plasma densities in the area of the workpieces as a function of the reactive gas flow.

FIG. 5, finally, is very informative. It is the result of tests in which, while the parameters were otherwise kept constant, the reactive gas flow F was varied, starting from the operating point 10 sccm. The straight line (a) was obtained with the low voltage discharge locally offset slightly with respect to the axis A of FIG. 1 by a magnetic field adjustment, which, on the substrate, resulted in a plasma density reduction or a lower rate, in the case of a discharge current $I_{AK}$ of 20 A.

Curve (b) shows the rate while the discharge is not deflected and at $I_{AK}$=20 A. Finally, (c) shows the increased rate while the discharge is not deflected with $I_{AK}$=70 A.

As confirmed in FIG. 3, a GR of approximately 15 Å/sec. is obtained in the case of a reactive gas flow of 10 sccm at a temperature of the substrate of 550° C. and 70A discharge current $I_{AK}$.

Figure 4:
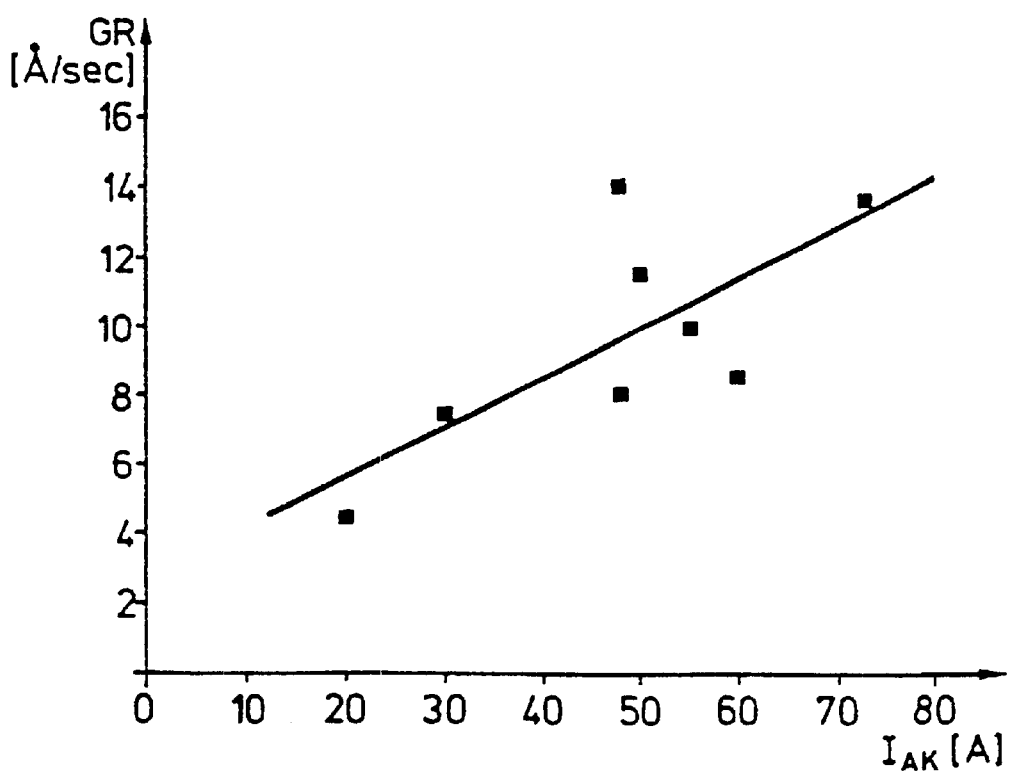
FIG. 4 is a view of the increase of the growth rate relative to the reactive gas flow $GR_r$ as a function of the discharge current.

In the case of a discharge current of 70 A with a reactive gas flow of 10 sccm, this result is also confirmed by FIG. 4.

In the case of a discharge current of 20 A, the GR decreases to approximately 6 Å/sec.

The results according to the invention will now be compared with the results of the prior art.

a) Comparison with APCVD (2)

From FIG. 5, the following is obtained, for example, for point P1:

GR≈1200 Å/min, compared with

GR≈2×10$^{-2}$ Å/min in the case of the APCVD.

From FIG. 5, the following value is obtained for point P1:

$GR_F$ of 80 Å/(sccm·min)

The corresponding value in the case of APCVD amounts to:

$GR_F$≈2×10$^{-4}$ Å/(sccm·min)

When, in the case of the LEPECVD according to the invention, the gas utilization number is calculated for a 3" substrate, the following is obtained:

$GA_F$≈6, 11×10$^{-2}$, corresponding to approximately (illegible).

In this case, it should be taken into account that this number becomes significantly better as the substrate surface becomes larger, for example, on 5".

Figure 7:
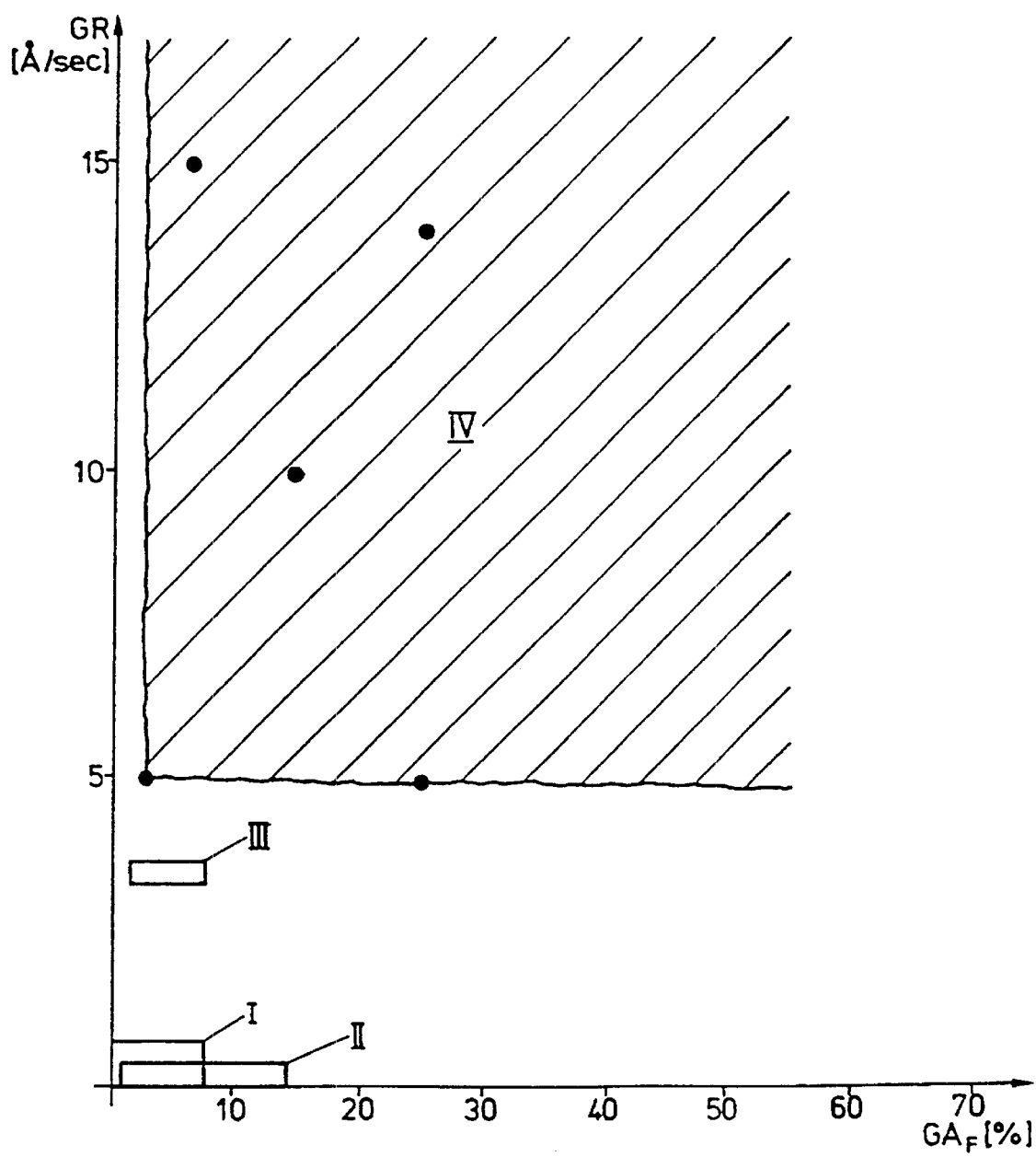
FIG. 7 is a view of the results according to the prior art and according to the invention in the growth rate/gas utilization number field.

FIG. 7 shows the following results:

In Field I: for ABCVD, LPCVD, RPECVD;

in Field II: for UHVCVD in Field III: for ECRCVD in Field IV: according to the present invention.

They apply to temperatures≦600° C.

In this context, it should be stressed again that the approach according to the invention permits the coating of relatively large surfaces, whereby the gas utilization number $GA_P$ also rises.

If, analogously, the large growth rate GR, the growth rate per reactive gas flow unit $GR_F$, and the gas utilization number $GA_F$ are compared with the corresponding number for CVD at atmospheric pressure conditions, drastic improvements occur according to the invention in every respect. If finally the results according to the present invention are compared with those which are obtained when a PECVD method is operated by means of low-voltage discharge according to German Patent Document DE-OS 36 14 384, it is found that astonishingly the growth rate of 1200 Å/min achieved according to the invention is significantly higher than the highest growth rates achieved by means of the previously known methods and that, in addition, the growth rate per reactive gas flow unit $GR_F$ achieved according to the invention is virtually by two powers of ten higher.

It is therefore extremely surprising that by means of very specific operating conditions at the system, as they were known in principle from German Patent Document DE-OS 36 14 384, such improvements can be achieved, taking into account that the layers deposited according to the invention correspond to epitaxy conditions with respect to the density of defects.

This was examined in a very simple manner in that, in the case of the described operation of the system according to FIG. 2, with the indicated operating point parameters, when inserting a monocrystalline substrate, a high-quality epitaxy coating was achieved but, when an amorphous substrate was inserted, with the same operating point parameters, an amorphous coating was obtained.

Furthermore, the measuring point is illustrated at P2 in FIG. 5, if, instead of a pure Si layer, an SiGe epitaxy layer is deposited which contains 4% Ge.

Figure 6:
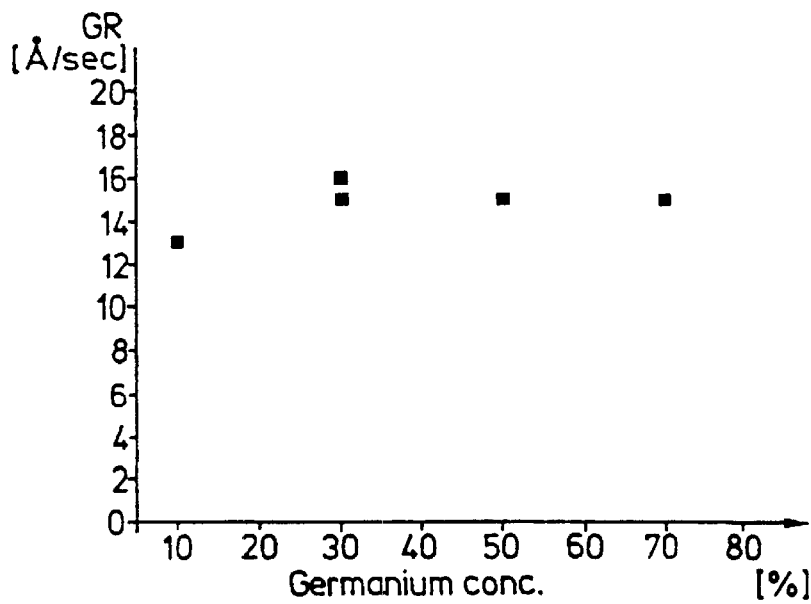
FIG. 6 is a view of the growth rate as a function of the germanium concentration on the deposited layer.

As indicated by the above, in contrast to the above-explained findings, in the case of the approach according to the invention, the conditions will not change when a GE/Si alloy is deposited. This is confirmed by FIG. 6, where, as a function of the Ge content, the growth rate GR is indicated in % at the indicated operating points. This shows that the growth rate essentially does not change in a very large range of the Ge to Si ratio.

The approach according to the invention was primarily confirmed by means of attempts to deposit Se, Ge or Si/Ge alloy layers or GA and GA bonding layers, all in a doped and undoped condition.

By means of the approach according to the invention, in a combined manner, the highest layer quality is achieved while the deposition rates are very high and the efficiency is simultaneously very high as far as deposited layer material per admitted reactive gas quantity is concerned, and at low temperatures≦600° C. Thus, the suggested approach is extremely well suited for industrial production, whether with respect to epitaxial layers or other layers of the highest quality.

What is claimed is:

1. A method for manufacturing coated workpiece comprising:
    (a) introducing a reactive gas into an evacuated recipient with said workpiece therein;
    (b) generating in said recipient a low-voltage plasma discharge by way of a cathode and
    (c) dissociating said reactive gas with said discharge as source of electrons, thereby maintaining a temperature of said workpiece at most 800° C;
    (d) PECVD coating said workpiece with a product of said dissociation at a growth rate of 300 Å/min. minimum, and
    (e) Establishing an ion energy at said workpiece during said coating of below 15 eV, thereby coating said workpiece with an epitaxial-coating quality.

2. The method of claim 1, further comprising the step of performing said coating with a gas utilization number of $1\% \leq GA_F \leq 90\%$.

3. The method of claim 1, further comprising the step of selecting said growth rate as:

$GR \geq 600$ Å/min.

4. The method of claim 3, wherein said growth rate is selected as $GR \geq 1000$ Å/min.

5. The method of claim 3, further comprising the step of selecting the gas utilization number as:

$GA_F \geq 5\%$.

6. The method of claim 1, further comprising the step of selecting the discharge voltage $U_{AK}$ of said discharge as:

$10 \text{ V} \leq U_{AK} \leq 80 \text{ V}$.

7. The method of claim 6, further comprising the step of selecting said discharge voltage as:

$20 \text{ V} \leq U_{AK} \leq 35 \text{ V}$.

8. The method of claim 1, further comprising the step of selecting the partial pressure $P_R$ of said reactive gas in said recipient as:

$10^{-5}$ mbar $\leq P_R \leq 10^{-1}$ mbar.

9. The method of claim 8, further comprising selecting said partial pressure as:

$10^{-4}$ mbar $\leq P_R \leq 10^{-2}$ mbar.

10. The method of claim 1, further comprising the step of selecting the total pressure is said recipient $P_T$ as:

$10^{-4}$ mbar $\leq P_T \leq 10^{-1}$ mbar.

11. The method of claim 1, further comprising the step of establishing in said recipient a partial working gas pressure $P_A$ as:

$10^{-4}$ mbar $\leq P_A \leq 10^{-1}$ mbar.

12. The method of claim 11, further comprising selecting said working gas partial $P_A$ as:

$10^{-3}$ mbar $\leq P_A \leq 10^{-2}$ mbar.

13. The method of claim 1, further comprising the step of generating the discharge voltage of said discharge between said cathode and an inner surface of said recipient, and operating said inner surface on a reference electric potential.

14. The method of claim 1, further comprising the step of operating said workpiece on one of a floating electric potential and a defined bias potential.

15. The method of claim 14, further comprising the step of operating said workpiece on a negative voltage $U_S$ with respect to an anode of said discharge.

16. The method of claim 15, wherein said voltage $U_S$ is selected as:

$U_S \geq -25$ V.

17. The method of claim 15, wherein said voltage $U_S$ is selected to be between −15 V and −3 V.

18. The method of one of the claim 13, further comprising the step of providing an auxiliary anode and operating said auxiliary anode on an adjustable electric voltage with respect to said cathode.

19. The method of claim 1, further comprising the step of depositing on said workpiece a Ga material.

20. The method of claim 1, further comprising the step of depositing on said workpiece material with at least one of Si and Ge.

21. The method of claim 1, further comprising the step of maintaining said temperature at a maximum of 600° C.

22. The method of claim 21, further comprising the step of depositing on said workpiece material with Si or Ge material.

23. The method of claim 1, further comprising the step of depositing on said workpiece a Ga material and operating said workpiece on or above 300° C.

24. The method of claim 1, further comprising the step of selecting a coating rate per reactive gas flow unit $GR_F$ to be at least 7.5 Å/(sccm.min).

25. The method of claim 24, wherein said coating rate per reactive gas flow unit $GR_F$ is selected as at least 10 Å/(sccm.min).

26. The method of claim 25, further comprising the step of selecting said coating rate per reactive gas flow unit $GR_F$ as at least 75 Å/(sccm.min).

27. The method of claim 1, further comprising the step of varying said coating rate by proportionally adjusting the reactive gas flow into said recipient.

28. The method of claim 1, further comprising the step of varying said coating rate by essentially proportionally adjusting the discharge current density.

29. The method of claim 1, further comprising the step of heating said workpiece independently of heating said workpiece by said discharge.

30. The method of claim 1, wherein said workpiece is coated with an epitaxy layer.

31. The method of claim 1, wherein said workpiece is coated with a semiconductor layer.

32. The method of claim 1, wherein said workpiece is coated with a semiconductor epitaxy layer.

33. The method of claim 1, further comprising the step of producing a workpiece with one of a polycrystalline and of an amorphous semiconductor layer.

34. The method of claim 1, further comprising the step of controlling whether an amorphous, a polycrystalline or an epitaxy layer is produced by characteristics of the uncoated workpiece.

35. The method of claim 34, further comprising the step of performing said controlling by way of surface characteristics of said uncoated workpiece.

36. The method of claim 1, wherein said workpiece is coated with a layer which comprises at least one of Si and Ge material.

37. The method of claim 36, further comprising the step of doping said layer with at least one element of at least one of the groups III and V of the Element Classification System.

38. The method of claim 1, wherein said workpiece is coated with layer comprising Ga material.

39. The method of claim 38, further comprising the step of doping said layer with at least one element of at least one of the groups II, III, IV and VI of the Element Classification System.

40. The method of claim 39, further comprising the step of doping said layer with Mg or Si material.

41. The method of claim 36, wherein at least one of a silicon and of a germanium containing gas is provided as said reactive gas.

42. The method of claim 41, further comprising the step of adding hydrogen gas to said reactive gas.

43. The method of claim 1, wherein said temperature is maintained at a 600° C. maximum.

44. The method of claim 1, wherein said workpiece is coated with a material containing at least one of Si and Ge material, and said temperature is maintained between 300° C. and 600° C.

45. The method of claim 1, wherein said workpiece is coated with a material containing Ga material and said temperature is maintained between 300° C. and 800° C.

46. The method of claim 1, wherein a workpiece holder in said recipient is electrically operable on an electric voltage adjustable between ±25 V with respect to an anode of discharge for said plasma.

47. The method of claim 30, wherein said tank comprises argon.

48. The method of claim 1, comprising the step of manufacturing solar cells.

49. The method of claim 1, further comprising generating said plasma as a DC discharge.

50. The method of claim 49, further comprising selecting the total pressure $P_T$ in said recipient as:

$10^{-4}$ mbar $\leq P_T \leq 10^{-1}$ mbar.

51. The method of claim 1, further comprising generating said plasma as a DC plasma with a discharge voltage applied between a cathode and an inner surface of said recipient, and operating said inner surface on a reference electric potential.

52. The method of claim 49, further comprising producing an auxiliary anode and operating said auxiliary anode at an adjustable voltage with respect to a cathode of a discharge generating said plasma.

53. The method of claim 49, further comprising generating said DC discharge by a cathode as an electron source.

54. The method of claim 1, wherein said temperature is maintained at 600° C. maximum.

55. The method of claim 1, further comprising varying said cathode rate by substantially proportionally adjusting the discharge current of a discharge generating said plasma.

56. The method of claim 1, further comprising producing a vacuum recipient and a cathode chamber coupled to said vacuum recipient via a diaphragm and with at least one cathode being said cathode chamber for generating said plasma.

57. The method of claim 49, further comprising the step of setting said discharge such that a measurement by way of a probe at the locus where afterwards a workpiece surface to be coated is to be positioned and on the same electrical potential as said workpiece surface becomes, results in a current density of at least 0.05 Å/cm² surface of said probe.

58. The method of claim 57, wherein said resulting density is at least 0.1 A/cm², up to a maximum density according to discharged current divided by a workpiece surface to be coated.

59. The method of claim 57, further comprising the step of predominantly generating said current density by electron incidence.

60. The method of claim 49, further comprising the step of selecting a discharge current $I_{AK}$ as:

$5 A \leq I_{AK} \leq 400 A$.

61. The method of claim 60, further comprising the step of selecting said discharge current as:

$20 \leq I_{AK} \leq 100 A$.

62. The method of claim 49, further comprising the step of providing an anode within said recipient for said discharge, said anode being electrically isolated with respect to said recipient.

63. The method of claim 62, further comprising the step of operating said workpiece on one of a floating electric potential and an electric bias potential.

64. The method of claim 63, further comprising the step of operating said workpiece with respect to said cathode at most on discharge voltage.

65. The method of claim 63, further comprising operating said workpiece with respect to a cathode for said DC discharge at most on discharge voltage.

66. The method of claim 49, further comprising the step of operating an inner surface of said recipient on a floating electric potential or via an impedance element tied to a reference electric potential.

67. The method of claim 49, further comprising the step of operating said workpiece with respect to an anode of said DC discharge at a voltage $U_S$ between −25 V and +25 V.

68. The method of claim 67, further comprising the step of selecting said voltage as:

$-20 V \leq U_S \leq +20V$.

69. The method of claim 68, further comprising the step of selecting said voltage $U_S$ to be negative.

70. The method of claim 50, further comprising selecting said total pressure as:

$10^{-3}$ mbar $\leq P_t \leq 10^{-2}$ mbar.

71. The method of claim 50, wherein said reference electric potential is ground potential.

72. The method of claim 51, further comprising the step of providing said auxiliary anode as a ring anode surrounding said discharge.

73. The method of claim 51, further comprising the step of operating said auxiliary anode at a voltage with respect to said cathode which is not larger than the discharge voltage of said discharge.

74. The method of claim 53, further comprising the step of maintaining said temperature between 300° C. and 600° C.

75. The method of further comprising adjusting at least one of discharge current, discharge voltage, a deflection and a bunching of said discharge with respect to said workpiece.

76. The method of claim 75, further comprising the step of adjusting one of said deflection and of said bunching, at least one of electrostatically and magnetically.

77. The method of claim 54, further comprising a gas feed line abutting into said cathode chamber and connected to a working gas tank.

78. The method of claim 55, further comprising the step of providing said workpiece in said recipient in an electrically insulated manner.

79. The method of claim 55, further comprising the step of providing a workpiece holder within said vacuum recipient, the electric potential thereof being one of adjustable with respect to the electric potential of an anode for said discharge and of being floating.

80. The method of claim 55, wherein the housing of said recipient is operated electrically on anodic potential.

81. The method of claim 55, further comprising the step of providing a magnet arrangement generating a magnetic field in said recipient which is coaxial to a central axis of said diaphragm or is offset thereto, said magnet arrangement comprising at least one of permanent and electromagnets.

82. The method of claim 55, further comprising the step of connecting said vacuum recipient to a turbo vacuum pump.

83. The method of claim 82, further comprising the step of connecting said recipient to a turbo molecular pump.

84. The method of claim 55, further comprising the step of arranging a workpiece holder within a highest electron density area of said discharge.

85. The method of claim 84, wherein said workpiece holder is arranged at least substantially concentrically to an axis of said diaphragm.

86. The method of claim 55, further comprising the step of providing a gas feed connection into said recipient said gas feed connection being connected to a gas tank arrangement containing at least one of Si-containing, a Ge-containing and a Ga-containing gas.

87. The method of claim 86, wherein said gas tank contains hydrogen.

88. The method of claim 73, wherein said anode is a ring anode.

* * * * *